(12) United States Patent
Naeve et al.

(10) Patent No.: US 11,303,222 B2
(45) Date of Patent: Apr. 12, 2022

(54) MULTIPHASE INVERTER APPARATUS

(71) Applicant: Infineon Technologies Austria AG, Villach (AT)

(72) Inventors: Tomasz Naeve, Finkenstein (AT); Elvir Kahrimanovic, Villach (AT); Petteri Palm, Regensburg (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 17/060,360

(22) Filed: Oct. 1, 2020

(65) Prior Publication Data
US 2021/0104957 A1    Apr. 8, 2021

(30) Foreign Application Priority Data
Oct. 2, 2019 (EP) .................................... 19201154

(51) Int. Cl.
*H02M 7/5387* (2007.01)
*H02M 1/088* (2006.01)
*H02M 7/00* (2006.01)

(52) U.S. Cl.
CPC ......... *H02M 7/5387* (2013.01); *H02M 1/088* (2013.01); *H02M 7/003* (2013.01)

(58) Field of Classification Search
CPC ...... H02M 7/5387; H02M 7/003; H02M 7/53; H02M 7/537
See application file for complete search history.

(56) References Cited

U.S. PATENT DOCUMENTS

| 5,130,918 A | 7/1992 | Schuster |
| 8,705,257 B2* | 4/2014 | Yamaguchi ............ H05K 7/209 363/132 |
| 10,236,791 B1 | 3/2019 | Chung et al. |
| 2007/0164423 A1 | 7/2007 | Standing |
| 2018/0174946 A1 | 6/2018 | Bayerer |

FOREIGN PATENT DOCUMENTS

EP    2775519 A2    9/2014

* cited by examiner

*Primary Examiner* — Gary L Laxton
(74) *Attorney, Agent, or Firm* — Murphy, Bilak & Homiller, PLLC (57) ABSTRACT

A multiphase inverter apparatus includes an insulating substrate, a plurality of half bridge circuits and a phase output lead for each half bridge circuit. The substrate includes a conductive redistribution structure on a first surface and having at least one low voltage bus and at least one high voltage bus. Each half-bridge circuit is electrically coupled between a low voltage bus and a high voltage bus and includes: a packaged low side switch; a packaged high side switch; and a phase output electrically coupled with the respective phase output lead. The packaged low side and high side switches are arranged on the first surface of the substrate. The phase output lead is arranged on and electrically coupled to the packaged low side and high side switches such that the low side and high side switches are arranged vertically between the phase output lead and the first surface of the substrate.

19 Claims, 8 Drawing Sheets

MULTIPHASE INVERTER APPARATUS

BACKGROUND

A multiphase inverter provides a circuit for converting an input power supply, for example a DC power supply, to two or more output phases and, therefore, to an AC power supply. Such a multiphase inverter apparatus may be used to drive an electric motor.

Multiphase inverter circuits may be provided in the form of a module, for example as disclosed in EP 2 775 519 A2, which includes not only the switches of the circuit but also control circuitry. U.S. Pat. No. 10,236,791 B1 discloses an inverter that includes a plurality of submodules which are connected together to provide an inverter circuit.

For practical applications, it is desirable to have good heat dissipation from multiphase inverter circuits and also that the multiphase inverter circuit has a small size.

SUMMARY

According to the invention, multiphase inverter apparatus is provided that comprises an insulating substrate, a plurality of half bridge circuits and a phase output lead for each half bridge circuit. The insulating substrate comprises a conductive redistribution structure on a first surface, the conductive redistribution structure comprising at least one low voltage bus and at least one high voltage bus. Each half-bridge circuit is electrically coupled between a low voltage bus and a high voltage bus. Each half bridge circuit comprises a packaged low side switch and a packaged high side switch and a phase output that is electrically coupled with the respective phase output lead. The packaged low side switch and the packaged high side switch are arranged on the first surface of the substrate. The phase output lead is arranged on and electrically coupled to the packaged low side switch and the packaged high side switch such that the packaged low side switch and the packaged high side switch are arranged vertically between the phase output lead and the first surface of the substrate.

In some embodiments, each half bridge circuit comprises a plurality of packaged low side switches electrically coupled in parallel with one another and a plurality of packaged high side switches coupled in parallel with one another and the phase output lead is arranged on and electrically coupled to the plurality of low side switches and the plurality of high side switches.

In some embodiments, the plurality of packaged low side switches is mounted on and electrically coupled to a common one of the low side buses and the plurality of packaged high side switches are mounted on and electrically coupled to a common one of the high side buses.

In some embodiments, the packaged low side switches each have power electrodes on opposing major sides and the packaged high side switches each have power electrodes on opposing major sides.

In some embodiments, the packaged low side switches each have a source down configuration and the packaged high side switches each have a drain down configuration.

In some embodiments, the phase output lead is arranged on and electrically connected with a drain electrode of the packaged low side switches and a source electrode of the packaged high side switches.

In some embodiments, the packaged low side switch comprises a first power electrode contact on a first side, the first power electrode being mounted on and electrically connected to the low voltage bus and a second power electrode contact on a second side opposing the first side, the phase output lead being mounted on and electrically connected to the second power electrode.

In some embodiments, the first power electrode of the packaged low side switch is a source electrode and the second power electrode of the packaged low side switch is a drain electrode.

In some embodiments, the packaged high side switch comprises a second power electrode contact on a first side, the second power electrode being mounted on and electrically connected to the high voltage bus and a first power electrode contact on a second side opposing the first side, the phase output lead being mounted on and electrically connected to the first power electrode.

In some embodiments, the first power electrode of the packaged high side switch is a source electrode and the second power electrode of the packaged high side switch is a drain electrode.

In some embodiments, the packaged low side switch and the packaged high side switch are disposed in a common package. Alternatively, in some embodiments, the packaged low side switch and the packaged high side switch are disposed in separate packages.

In some embodiments, the packaged high side switch comprises a MOSFET or IGBT or BJT or a HEMT and the low side switch comprises as MOSFET or IGBT or BJT or a HEMT.

In some embodiments, the half bridge circuits of each phase are mounted laterally adjacent one another on the first surface of the substrate, wherein the packaged low side switch of a first half bridge circuit and the packaged low side switch of a second half bridge circuit are mounted on and electrically coupled to a common low voltage bus and the packaged high side switch of the second half bridge circuit and the packaged high side switch of a third half bridge circuit are mounted on and electrically coupled to a common high voltage bus.

In some embodiments, the multiphase inverter apparatus provides a three phase inverter circuit.

In some embodiments, the multiphase inverter apparatus further comprises a high voltage lead positioned on the high voltage bus and a low voltage lead positioned on the low voltage bus.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Exemplary embodiments are depicted in the drawings and are detailed in the description which follows.

FIG. 2b illustrates a cross-sectional view of the multiphase inverter apparatus of FIG. 2a.

FIG. 2c illustrates an enlarged cross-sectional view of a half bridge circuit of the multiphase inverter apparatus of FIG. 2a.

FIG. 2d illustrates an enlarged plan view of a first half bridge circuit of the multiphase inverter apparatus of FIG. 2a.

DETAILED DESCRIPTION

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of exemplary embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

As employed in this specification, when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present.

As employed in this specification, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 1:
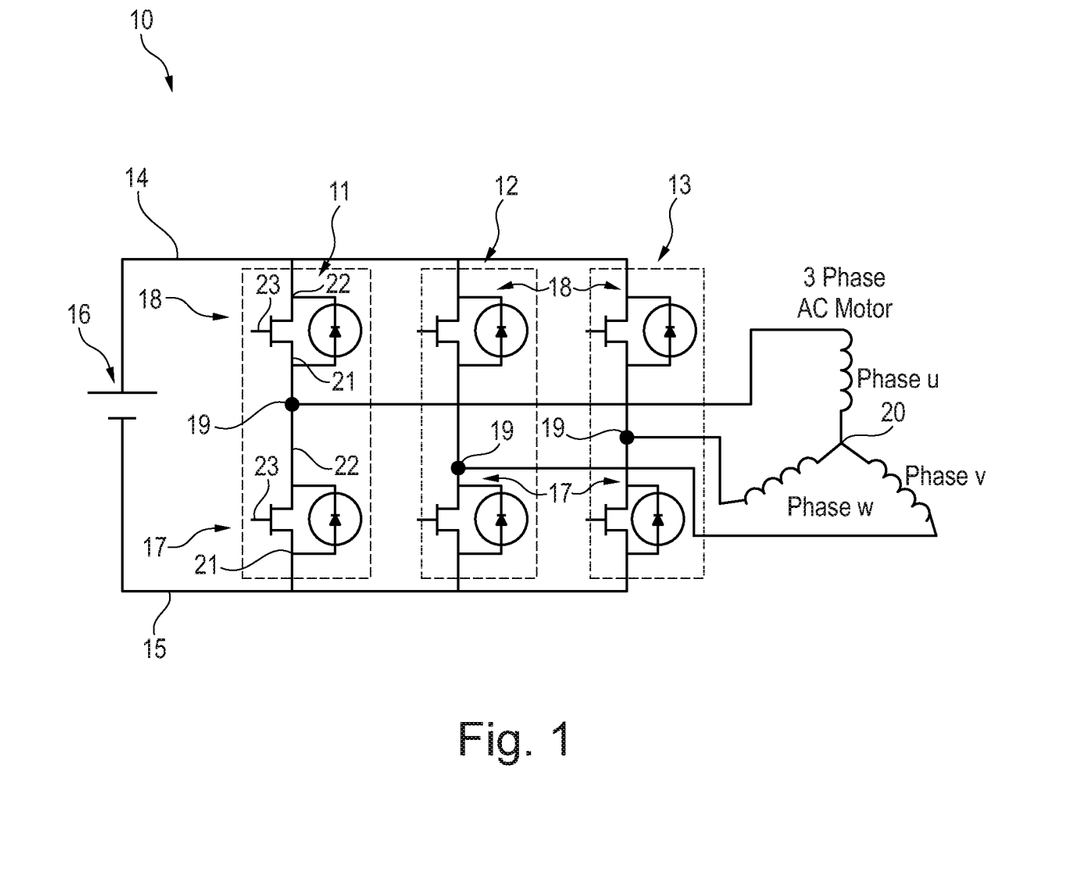
FIG. 1 illustrates a schematic view of a multiphase inverter circuit.

FIG. 1 illustrates a diagram of a multiphase inverter circuit 10. The multiphase inverter circuit 10 comprises a plurality of half bridge circuits 11, 12, 13, one for each phase. In the embodiment illustrated in FIG. 1, the multiphase inverter circuit is a three phase inverter circuit and comprises three half bridge circuits 11, 12, 13, each having a phase output.

Each half bridge circuit 11, 12, 13 is electrically coupled between a high-voltage bus 14 and a low voltage bus 15. The high-voltage bus 14 and the low voltage bus 15 are electrically connected to the high-voltage and low-voltage terminals, respectively, of a power supply 16 which in the embodiment illustrated in FIG. 1 is a DC power supply. In the following, the arrangement of the half bridge circuit will be described with reference to the first half bridge circuit 11. Each of the half bridge circuits 11, 12, 13 of the multiphase inverter 10 has the arrangement which is described with reference to the half bridge circuit 11.

The half bridge circuit 11 includes a low side switch 17 and a high side switch 18 which are electrically coupled in series at an output node 19 which is electrically coupled to a load 20. The load 20 may be an electric motor, for example. Each of the low side switches 17 and the high side switches 18 may be provided by a transistor device, such as a MOSFET device. Each of the transistor devices includes a source terminal 21, a drain terminal 22 and a gate terminal 23. The source 21 of the low side switch 17 is electrically coupled to the low voltage bus 15 and the drain terminal 22 of the low side switch 17 is electrically coupled to the source 21 of the high side switch 18, with the phase output 19 electrically coupled between the drain terminal 22 of the low side switch 17 and the source terminal 21 of the high side switch 18. The drain terminal 22 of the high side switch 18 is electrically coupled to the high-voltage bus 14. The gate terminals 23 of the low side switch 17 and of the high side switch 18 are electrically coupled to driver circuitry which is not illustrated in the circuit diagram of FIG. 1.

In some embodiments, the half bridge circuit 11 includes a plurality of low side switches that are electrically coupled in parallel with one another and a plurality of high side switches which are electrically coupled in parallel with one another in order to increase the current carrying capacity of the half bridge circuit 11 and of the multiphase inverter circuit 10.

The arrangement of the second and third half bridge circuits 12,13 is the same such that each half bridge circuit 11, 12, 13 is electrically coupled in parallel between the high-voltage bus 14 and the low voltage bus 15 and each includes a phase output that is electrically coupled to the load 20. The first half bridge circuit 11 may provide the U phase, the second half bridge circuit 12 the V phase and third half bridge circuit 13 the W phase of the multiphase inverter circuit 10.

Figure 2A:
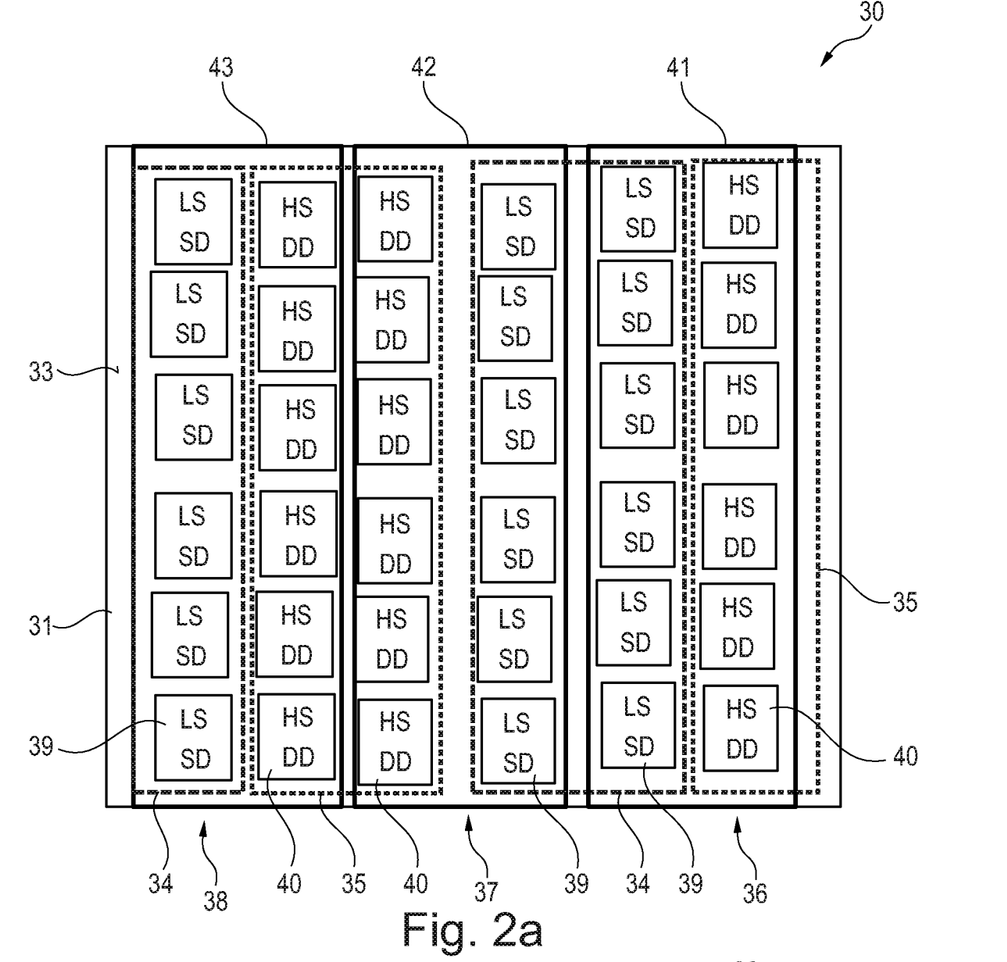
FIG. 2a illustrates a plan view of multiphase inverter apparatus.
Figure 2B:
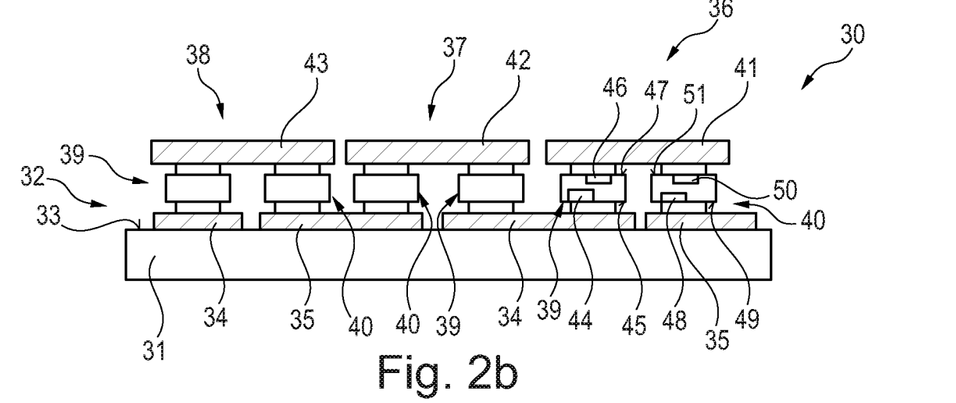

FIG. 2a illustrates a plan view and FIG. 2b illustrates a cross-sectional view of a multiphase inverter apparatus 30 according to an embodiment. The multiphase inverter apparatus 30 may provide the circuit 10 illustrated in FIG. 1.

The multiphase inverter apparatus 30 includes an insulating substrate 31 which comprises a conductive redistribution structure 32 arranged on a first surface 33. The conductive redistribution structure 32 comprises at least one low-voltage bus 34 and at least one high-voltage bus 35. The low-voltage bus 34 and the high-voltage bus 35 may each have the form of a conductive layer positioned on the first surface 33 which may have an elongate strip-like form. The elongate strip type forms and, consequently, the low-voltage bus 34 and high-voltage bus 35 extend substantially parallel to one another on the first surface 33 of the insulating substrate 31.

The multiphase inverter apparatus 30 includes a plurality of half bridge circuits. The multiphase inverter apparatus 30 illustrated in FIGS. 2a and 2b is a three phase inverter and, therefore, includes three half bridge circuits 36, 37, 38. However, the same arrangement may be used for multiphase inverter apparatus including two phases or more than three phases. Each half bridge circuit 36, 37, 38 includes a packaged low side switch 39, a packaged high side switch 40 and a phase output 39. A first phase output lead 41 is coupled to the first phase output of the half bridge circuit 36.

The packaged low side switch 39 and the packaged high side switch 40 are arranged on the first surface 33 of the insulating substrate 31 and the first phase output lead 41 is arranged on and electrically coupled to low side switch 39 and the high side switch 40 of the first half bridge circuit 36 such that the packaged low side switch 39 and the packaged high side switch 40 of the first half bridge circuit are arranged vertically between the first phase output lead 41 and the first surface 33 of the insulating substrate 31. The packaged low side switch 39 and the packaged high side switch 40 can be considered to be sandwiched between the first phase output lead 41 and the first surface 33 of the insulating substrate 31.

Since the multiphase inverter apparatus 30 is three phase inverter, it also includes a second phase output lead 41 and a third phase output lead 42. The second phase output lead 41 is arranged on and electrically coupled to low side switch 39 and the high side switch 40 of the second half bridge circuit 37 such that the packaged low side switch 39 and the packaged high side switch 40 of the second half bridge circuit 37 are arranged vertically between the second phase output lead 42 and the first surface 33 of the insulating substrate 31. The third phase output lead 41 is arranged on and electrically coupled to low side switch 39 and the high side switch 40 of the third half bridge circuit 38 such that the packaged low side switch 39 and the packaged high side switch 40 of the second half bridge circuit 38 are arranged vertically between the third phase output lead 43 and the first surface 33 of the insulating substrate 31.

The first, second and third phase output leads 41, 42, 43 extend substantially parallel to one another and are spaced apart from one another. The first, second and third phase output leads 41, 42, 43 extend substantially parallel to the conductive strips on the first surface 33 of the substrate 31 that provide the low and high voltage buses 34, 35.

The packaged low side switch 39 includes a first power electrode 44 on a first side 45 and a second power electrode 46 on a second side 47 that opposes the first side 45. The first power electrode 44 is mounted on and electrically coupled to the low voltage bus 34 so that the second power electrode 46 faces upwardly away from the insulating substrate 31.

The packaged high side switch 40 includes a second power electrode 48 on a first side 49 and a first power electrode 50 on the second side 51 that opposes the first side 49. The second power electrode 48 is mounted on and electrically coupled to the high-voltage bus 35 such that the first power electrode 50 faces upwards and away from the insulating substrate 31.

The first phase output lead 41 is arranged on and electrically coupled to the second power electrode 46 of the low side switch 39 and to the first power electrode 50 of the high side switch 40 and electrically couples the second power electrode 46 of the low side switch 39 to the first power electrode 50 of the high side switch 40 so as to provide the first phase output of the first half bridge circuit 36 and form the half bridge circuit 36.

The low side switch 39 and the high side switch 40 of the half bridge circuits 36, 37, 38 may each comprise a transistor device such as a MOSFET device, Insulated Gate Bipolar Transistor (IGBT) device or a bipolar junction transistor (BJT) device.

A semiconductor package includes one or more semiconductor devices, e.g. transistor devices, accommodated within a housing which, typically, covers the semiconductor device. The housing may also be referred to has encapsulation. The housing may include a plastic material, such as epoxy resin, and may be formed by a mold process, such as injection molding. The package includes internal electrical from the semiconductor device to a substrate or a leadframe connections which are covered by the housing. The substrate or leadframe also provides the outer contacts, or electrodes, of the package and enables the semiconductor device to be electrically accessed from external to the package. The outer contacts may have the form of pins or solder balls, for example, and may be used to mount the electronic component on a substrate, for example a redistribution board, such as a printed circuit board.

Therefore, the packaged low side switch 39 and the packaged high side switch 40 each include a switch, such as a transistor device, within a housing so that the switch is packaged. This distinguishes the low side switch and the high side switch from arrangements included a bare die that is unpackaged and does not include a housing.

As used herein, each of the transistor devices is described as including a source, a drain and a gate. As used herein, the electrodes or terminals of the transistor device are referred to as source, drain and gate. Therefore, these terms also encompass the functionally equivalent terminals of other types of devices, such as an insulated gate bipolar transistor. For example, as used herein, the term "source" encompasses not only a source of a MOSFET device but also an emitter of an insulator gate bipolar transistor (IGBT) device and an emitter of a BJT device, the term "drain" encompasses not only a drain of a MOSFET device but also a collector of an insulator gate bipolar transistor (IGBT) device and a collector of a BJT device, and the term "gate" encompasses not only a gate of the MOSFET device but also a gate of an insulator gate bipolar transistor (IGBT) device and a base of a BJT device.

The packaged low side switch 39 and the packaged high side switch 40 include a transistor device such as a MOSFET device. The first power electrode 44 of the packaged low side switch 39 may be coupled to source of the transistor device providing the low side switch 39 and the second power electrode 46 may be electrically coupled to drain of the transistor device providing the low side switch 39.

The first power electrode 50 of the high side switch 40 is electrically coupled to source of the transistor device providing the high side switch 40 and the second power electrode 48 is electrically coupled to the drain of the transistor device providing the high side switch 40.

In the embodiment illustrated in FIGS. 2a and 2b, the packaged low side (LS) switch 39 can be described as having a source down (SD) arrangement since the first power electrode 44 which is electrically coupled to the source faces downwardly towards the insulating substrate 31. The packaged high side (HS) switch 40 can be considered to have a drain down (DD) or source up configuration as the second power electrode contact 48 which is electrically coupled to drain faces downwardly towards the insulating substrate 31. Each of the second and third half bridge circuit 37, 38 may have the same arrangement as that described for the first half bridge circuit.

In some embodiments, each half bridge circuit 36, 37, 38 may be positioned laterally adjacent one another on the first surface 33 of the substrate 31. In these embodiments, neighbouring half bridge circuits may be mounted on and electrically coupled to a common voltage bus. For example, in the embodiment illustrated in FIGS. 2a and 2b, the source electrodes of the low side switches 39 of the first and second half bridge circuits 36, 37 are mounted on a common conductive strip of the low-voltage bus 34 and the drain electrodes of the high side switches 40 of the second and third half bridge circuits 37, 38 are mounted on a common strip of the high-voltage bus 35. The drain electrode of the high side switch 40 of the first half bridge circuit 36 is mounted on a further conductive strip of the low voltage bus 34 and the source electrode of the low side switch 39 of the third half bridge circuit 38 is mounted on a further conductive strip of the high voltage bus 35.

Each of the phase output leads 41, 42, 43 are, however, separate from one another and have an elongate form and are positioned in a plane above the plane of the low and high voltage buses 34, 35 and have a long direction that extends substantially parallel to the long direction of the conductive strips of the low and high voltage buses 34, 35.

In some embodiments, such as that illustrated in FIGS. 2a and 2b, each of the half bridge circuits 36, 37, 38 includes a plurality of low side switches 39 and a plurality of high side switches 40. In the embodiment illustrated in FIG. 1, each of the half bridge circuits 36, 37, 38 includes six packaged low side switches 39 and six packaged high side switches 40. The plurality of packaged low side switches 39 of each half bridge circuit are electrically coupled in parallel with one another and the plurality of high side switches 40 of each half bridge circuit are electrically coupled in parallel with one another.

Referring to the first half bridge circuit 36, the plurality of low side switches 39 each have a first power electrode 49 arranged on a first side 45 which is mounted on and electrically coupled to the conductive strip of the low-voltage bus 34. Each of the second power electrodes 46 of the low side switches 39 are electrically coupled to a common phase output lead 41 so that the plurality of low side switches 39 are electrically coupled in parallel between the conductive strip of the low voltage bus 34 and the first phase output lead 41.

Similarly, the second power electrode 48 of each of the packaged high side switches 40 are mounted on and electrically coupled to a common conductive strip of the high-voltage bus 35 and each of the first power electrodes 50 of the high side switches 40 are electrically coupled to the first phase output lead 41 so that the plurality of high side switches 40 are electrically coupled in parallel between the conductive strip of the high voltage bus 35 and the first phase output lead 41. Thus, the current carrying capability of the half bridge circuit 36 is increased by a factor of six.

The packaged low side switches 39 and the packaged high side switches 40 have contacts on opposing major surfaces thus allowing them to be mounted vertically between, or sandwiched, between the respective phase output lead 41, 42, 43 and the conductive redistribution structure 32 arranged on the first surface 33 of the substrate 31. Thus, lateral space can be saved over arrangements in which the phase output leads 41, 42, 43 are positioned that laterally between the high side switches 40 and low side switches 39 of the half bridge circuits 36, 37, 38 and directly on the first surface 33 of the insulating substrate 31.

The packaged low side switches 39 and the packaged high side switches 40 may include different package types. Examples of packages for low side switches and high side switches of the half bridge circuit are illustrated in FIGS. 2c and 3 to 7.

Figure 2C:
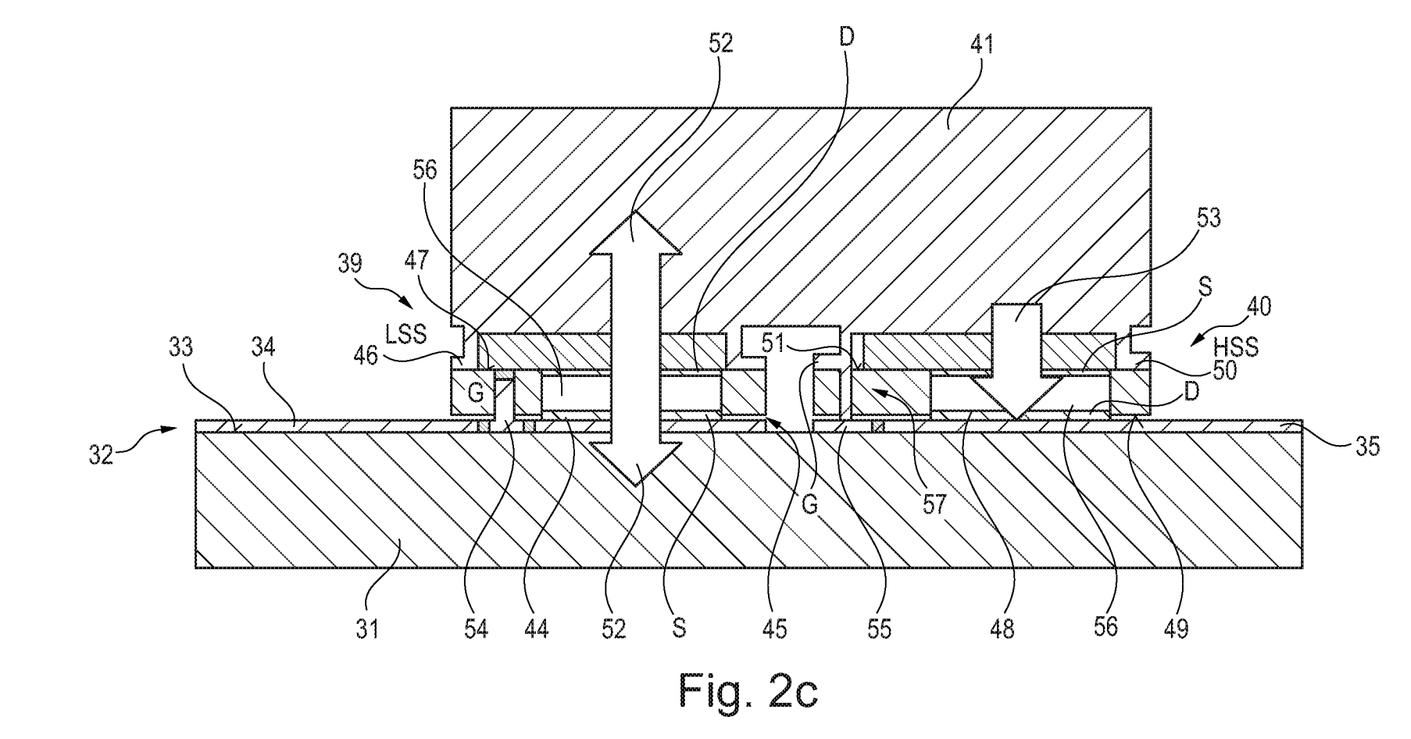

FIG. 2c illustrates an enlarged cross-sectional view of the first half bridge circuit 36 and illustrates schematically with the arrows 52 that heat can be dissipated from the packaged low side switch 39 and the packaged high side switch 40 in opposing directions and upwardly into the phase output lead 41 and downwardly into the insulating substrate 31. FIG. 2c also illustrates with the arrow 53 that the current carrying direction is also substantially vertical between the second power electrode 46 of the low side switch and the phase output lead 41 and between the phase output lead 41 and the first power electrode 50 of the packaged high side switch 40. This is in contrast to an arrangement in which the phase output lead 41 is positioned laterally adjacent to the side faces of the packaged low side switch 39 and the packaged high side switch 40 which then necessarily has a larger horizontal current carrying path.

Also seen in the enlarged cross-sectional view of FIG. 2c are the electrical connections for the gate electrode 54 of the packaged low side switch 39 and the gate electrode 55 of the packaged high side switch 40.

The transistor device which is accommodated within the packaged low side switch 39 and/or packaged high side switch 40 may itself be a vertical transistor device 56 having a vertical drift path which extends between two opposing major surfaces. However, the drift path of the transistor device accommodated within the package is independent of the arrangement of the power electrodes of the packages on the two opposing sides, since a suitable internal rewiring arrangement may be used to electrically couple the terminals of the transistor device to the desired side of the package.

For example, in the embodiment illustrated in FIG. 2c, the packaged high side switch 40 has a drain down configuration and accommodates a vertical transistor device 56 in which the source S and gate G are positioned on the side facing upwards and the drain D faces downwards towards the substrate 31. Consequently, the package provides a conductive redistribution structure 57 including a vertical portion that couples the gate G of the transistor device 56 which faces upwardly to the gate electrode 55 of the package that positioned downwardly and facing the first surface 33 of the substrate 31.

The low side switch 39 includes a vertical transistor device 56 in which the source S and gate G are positioned on the side 45 which faces downwards towards the substrate 31 and the drain D is positioned on the opposing side 47 and faces upwards. The package of the low side switch 39 may include a lateral redistribution structure between the source S and gate G of the transistor device 56 and the source and gate electrodes 44, 54 of the package.

Figure 2D:
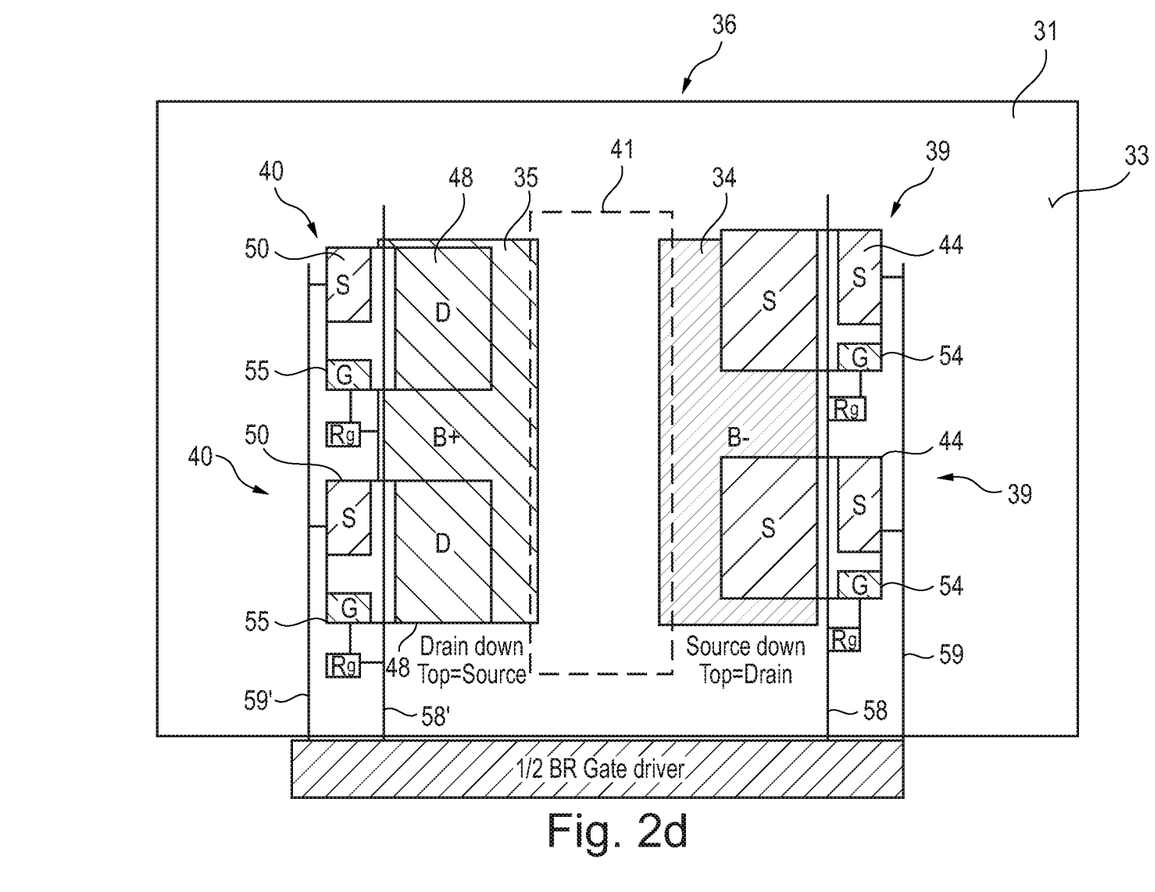

FIG. 2d illustrates an enlarged plan view of one of the half bridges, for example, the first half bridge 36 and further illustrates an example of the layout of the electrical connections between the source electrodes and gate electrodes and the gate driver. The gate electrodes 54 of the low side switches may be electrically connected to the gate driver by means of a conductive redistribution structure positioned on the upper surface 33 of the substrate 31. The conductive redistribution structure for the gate electrodes 54 of the low side switches 39 may include a conductive trace 58 which extends substantially parallel to the low voltage bus 34 such that each of the gate electrodes 54 of the plurality of packaged low side switches 39 of a single half bridge circuit are connected in parallel to the conductive trace.

Similarly, the gate electrodes 55 of the packaged high side switches 40 may be electrically connected to the gate driver by means of a conductive redistribution structure positioned on the upper surface 33 of the substrate 31. The conductive redistribution structure for the gate electrodes 55 of the high side switches 40 may include a conductive trace 58' which extends substantially parallel to the low voltage bus 35 such that each of the gate electrodes 55 of the plurality of packaged high side switches 40 of a single half bridge circuit are connected in parallel to the conductive trace.

A further conductive trace 59 which also extends substantially parallel to the low voltage bus 34 and the conductive trace 58 for the gate electrodes 54 may be provided which is electrically coupled to each of the source electrodes 44 of the packaged low side switches 39 and a further conductive trace 59' which also extends substantially parallel to the high voltage bus 35 and the conductive trace 58' for the gate electrodes 55 may be provided which is electrically coupled to each of the source electrodes 50 of the packaged high side switches 40.

As discussed above, the multiphase inverter apparatus 30 comprises a plurality of half bridge circuits 36, 37, 38, each having at least one packaged low side switch 39 and at least one packaged high side switch 40. Each of the packaged low side switches 39 may have power electrodes positioned on opposing major sides of the package. Similarly, each of the packaged high side switches 40 may have power electrodes positioned on opposing major sides of the package. This enables each packaged low side switch 39 and each packaged high side switch 40 to be electrically accessed from the two opposing sides and enables the packaged low side switches 39 and packaged high side switches 40 to be disposed between the respective phase output lead 41 and the first surface 33 of the substrate 31 and to include electrical connections on two opposing major sides.

The packaged low side switches 39 and packaged high side switches 40 may include a single power electrode on each of the two opposing major sides, or more than one power electrode positioned on one or both of the opposing major sides. In embodiments in which a major side includes two or more power electrodes, the power electrodes may be electrically coupled to differing terminals of the switch, for example source and drain, or the same terminal, e.g. source.

FIGS. 3 to 6 illustrate packaged low side switches 39 and packaged high side switches 40 according to various embodiments that may be used to provide the multiphase inverter apparatus according to any one of the embodiments described herein. Each drawing illustrates a pair of switches including a low side switch 39 and high side switch 40, each accommodated within a separate package. However, the illustrated individual package switches are not limited to being used together in this pair to form a half bridge.

The packages will be described with reference to the first half bridge circuit 36 of the multiphase inverter apparatus 30 of FIGS. 2a through 2d. However, the packages may also be used for the further half bridge circuits of the multiphase inverter apparatus. Each of the half bridges of the multiphase inverter apparatus commonly has the same arrangement. However, the arrangement of the half bridges of the multiphase inverter apparatus may differ from one another.

Figure 3:
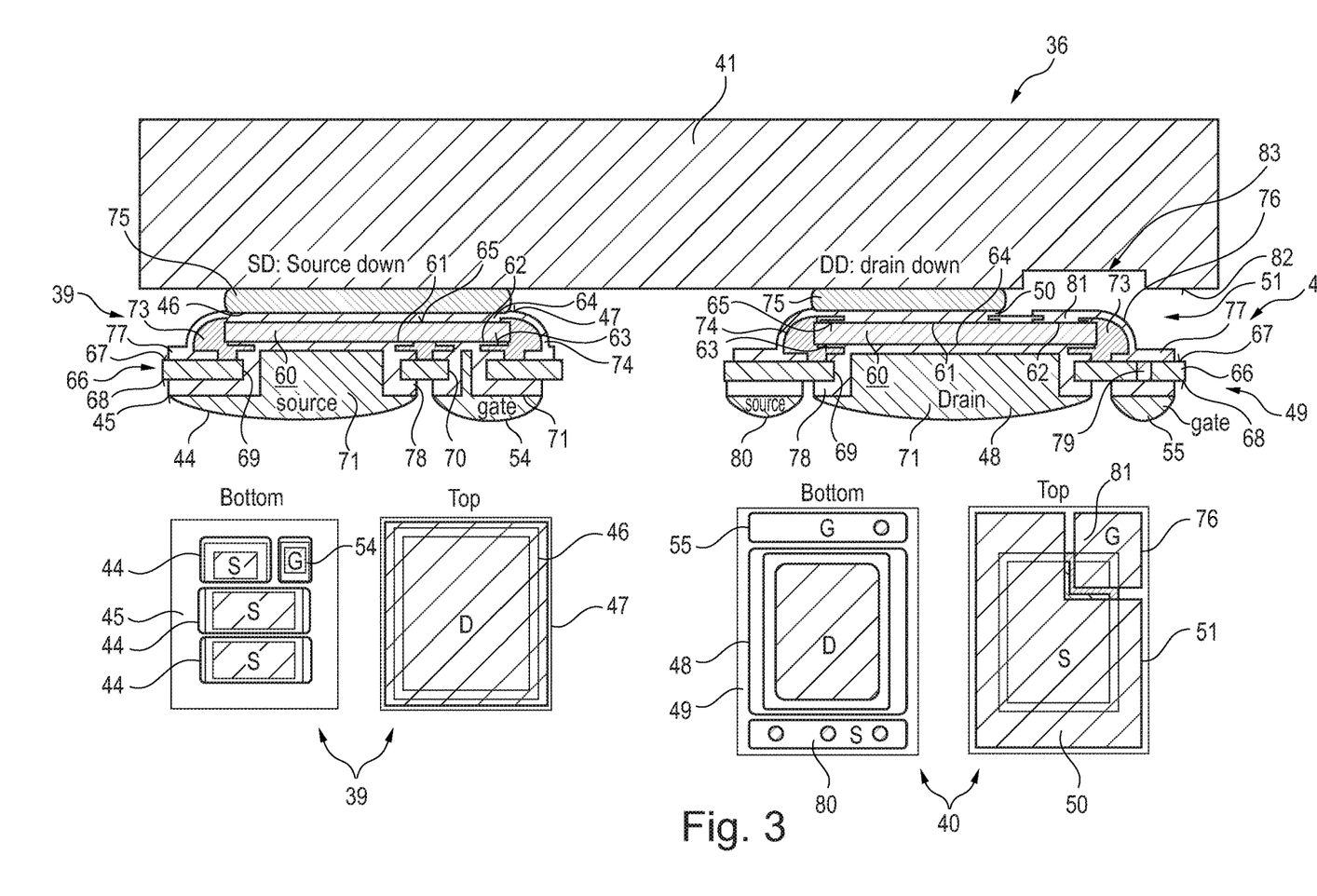
FIG. 3 illustrates a cross-sectional view of half bridge circuit according to an embodiment.

FIG. 3 illustrates a cross-sectional view of a half bridge circuit 36 including a packaged low side switch 39 and a packaged high side switch 40, a bottom plan view and a top pan vies of the packaged low side switch 39 and a bottom plan view and a top plan view of the packaged high side switch 40.

The packaged low side switch 39 having a source down (SD) configuration with the source electrode 44 positioned on a first major side 45 and the drain electrode 46 arranged on the opposing second major side 47

The packaged low side switch 39 includes a transistor device 60 which has a vertical drift path and a source terminal 61 and a gate terminal 62 positioned on a first major surface 63 and a drain terminal 64 positioned on the opposing second major surface 65 of the transistor device 60. The packaged low side switch 39 also includes a redistribution substrate 66 having a first side 67, on which the transistor 60 is disposed, and an opposing second side 68, which provides the first side 45 of the packaged low side switch 39 on which the source electrode 44 and gate electrode 54 of the packaged low side switch 39 are positioned.

The redistribution substrate 66 may include a layer of an insulating material, for example a core layer provided by a prefabricated board, and a conductive layer on each of the two opposing sides 67, 68. Each conductive layer 77, 78 may be patterned to provide a conductive structure, whereby the conductive layer on the second side 67 may provide the conductive electrodes of the package. The redistribution substrate 66 also includes vertical conductive connections extending from the first side 67 to the second side 68 of the redistribution substrate 66.

The source terminal 61 of the transistor device 60 is positioned on the first side 67 of the redistribution substrate 66 above an aperture 69 which extends through the thickness of the redistribution substrate 66. Similarly, the gate terminal 62 of the transistor device 60 is positioned on the first side 67 of the redistribution substrate 66 and above a further separate aperture 70 which extends through the thickness of the redistribution board 66.

The source terminal 61 is electrically connected to the source electrode 44 that is formed by the second conductive layer 78 on the opposing second side 68 of the redistribution substrate 66 by an electrical connection which extends through the aperture 69. The electrical connection may comprise solder 71 and/or a metallic lining of the aperture 69 which is in contact with the second conductive layer 77 on the first side 67 and the first conductive layer 78 on the first side 68 of the redistribution substrate 66. The solder 71 extends onto the first conductive layer 78 to from the source electrode 44. Similarly, the conductive redistribution structure between the gate terminal 62 and the opposing second side 68 of the redistribution substrate 66 may include a solder 71 which is positioned in the aperture 70 and/or a conductive lining of the aperture 70. The solder 71 extends over the first conductive layer 78 positioned on the second side 68 of the redistribution substrate 66 to provide the gate electrode 54 positioned on the first major surface 45 of the packaged low side switch 39. The gate electrode 54 is spaced apart from the source electrode 44.

As can be seen in the bottom plan view of the packaged low side switch 39, which illustrates the footprint of the package, the first side 45 of the packaged low side switch 39 includes three source electrodes 44 which are laterally spaced apart from one another and one gate electrode 54. The top plan view illustrates that the second major surface 47 of the packaged low side switch 39 includes a single drain electrode 46 which extends substantially over the entire second side 47 of the packaged low side switch 39.

In some embodiments, the side faces of the transistor device 60 are embedded in the insulating material 73, for example an epoxy resin. The epoxy resin may also be positioned on and extend over the edges of the transistor device 60 onto the peripheral edges of the first and second surfaces 63, 65 of the transistor device 60 and onto the first side 67 of the redistribution substrate 66. Insulating material may also be positioned between the first surface 63 of the transistor device 60 and the first surface 67 of the redistribution substrate 66 in regions adjacent to the source and gate terminals 61, 62.

In some embodiments, a further conductive layer 74 extends over the outer surface of the insulating material 73 from the drain terminal 65 of the transistor device to the opposing side of the transistor device 60 and to the first conductive layer 77 positioned on the first side 67 of the redistribution board 66. This additional conductive layer 74 may provide an electrical connection. This additional electrical connection 74 does not have to extend to the opposing second side 68 of the redistribution substrate 66 since the drain terminal 64 is electrically connected to the first phase output lead 41 by the solder 75. The drain terminal 64 alone may provide the drain electrode 46 of the low side switch 39 or a further conductive layer, such as the conductive layer 74, may be positioned on the drain terminal 65 to form the drain electrode 46. The first phase output lead 41 may be mounted on and electrically coupled to the drain electrode 46 by a solder layer 75. An electrically conductive adhesive could be used in place of solder.

Still referring to FIG. 3, the packaged high side switch 40 also includes a transistor device 60 including a vertical drift path which is mounted on a first major surface 67 of a redistribution board 66. The packaged high side switch 40 has, however, a drain down (DD) configuration. The drain terminal 64 of the transistor device 60 also faces downwards and is mounted on the first side 67 of the redistribution substrate 66 and above an aperture 69 in the redistribution substrate 66. The source terminal 61 and gate terminal 62 face upwardly towards the first output phase lead 41. The drain terminal 65 is electrically connected to the drain electrode 48 that is arranged on the opposing second side 68 of the redistribution substrate 66, which forms the first side 49 of the packaged high side switch 40, by solder 71 arranged in the aperture 69 and/or a conductive lining of the aperture 69. The side faces and edge regions of the transistor device 60 are embedded in insulating material 73 which is used to support a conductive layer 76 providing an electrical connection from the gate terminal 62 of the transistor device 60, which faces upwardly away from the redistribution substrate 66, to the first side 67 of the redistribution substrate 66 and to a conductive trace 77 arranged on the first side 67 of the redistribution structure 66. This conductive trace 77 is electrically connected to the gate electrode 55 positioned on the opposing surface 68 of the redistribution board 66 by a vertical conductive connection 79 which is positioned in, and extends through, the thickness of the redistribution substrate 66. The vertical conductive connection 79 may be a conductive via or may be an aperture filled with solder similar to the connection between the drain electrode 48 and the drain terminal 65. The source terminal 61 of the transistor device 60 faces upwards and is electrically connected to the first output phase lead 41 by solder connection 75.

In some embodiments, a further conductive layer 74, which is positioned on the insulating material 73, extends from the upwardly facing source terminal 61 to the first major surface 67 of the redistribution structure 66. In some embodiments, the conductive layer 74 is electrically connected to a further electrode 80 positioned on the opposing second side 68 of the redistribution substrate 66, which forms the first side 49 of the packaged high side switch 40, by a vertical conductive connection which extends through the thickness of the redistribution board 66. This vertical connection may be a conductive via or aperture filled with solder, for example.

The peripheral edge regions of the first major surface 63 of the transistor device 60, the regions between the source terminal 61 and the conductive layer 74, the regions between the gate terminal 62 and the conductive layer 76 and the regions between the source terminal 61 and gate terminal 62 may include an additional insulation passivation layer which may, for example, comprises oxide or nitride.

FIG. 3 also illustrates a plan view of the bottom side 49 of the packaged high side switch 40 and illustrates that the bottom side 49 includes the further source electrode 80 which is electrically connected to the source terminal 62 of the transistor device 60 and positioned towards a first lateral edge of the first major side 49, a gate electrode 55 positioned at the opposing lateral side of the first major surface 49 and a drain electrode 48, which is electrically connected to the drain terminal 65 of the transistor device 60, positioned between the electrodes 80 and 55.

The top side 51 of the packaged high side switch 40 includes a source electrode 50 which is connected to the source terminal 62 of the transistor device 69 and a second gate electrode 81 which is positioned above and electrically coupled to the gate terminal 62 of the transistor device 60. In the mounted position, the upwardly facing gate electrode 81 is spaced apart from the lower surface 82 of the first output phase lead 41 by a distance due to the thickness of the solder connection 75. In some embodiments, the lower surface 82 of the first output phase lead 41 may include a recess or cutout portion 83 which is positioned vertically above the gate electrode 81 in order to increase the distance and electrical isolation between the gate electrode 81 and the first output phase lead 41.

Figure 4:
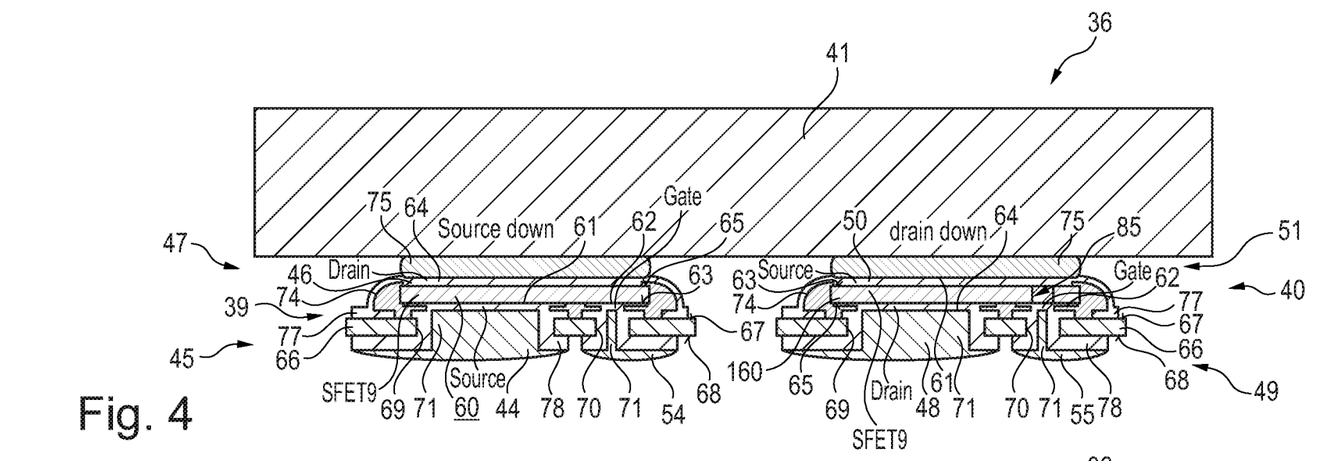
FIG. 4 illustrates a cross-sectional view of half bridge circuit according to an embodiment.

FIG. 4 illustrates a half bridge circuit 36 including a packaged low side switch 39 which has the same structure as the packaged low side switch 39 illustrated in FIG. 3 and a packaged high side switch 40 which has a similar structure to the packaged high side switch 40 illustrated in FIG. 3. However, the packaged high side switch 40 of the embodiment illustrated in FIG. 4 differs in the arrangement of the terminals on the transistor device 160. The transistor device 160 includes a source terminal 62 on the first major surface 63 which faces upwards towards the phase output lead 41 and a drain terminal 64 on the second major surface 65 that faces downwards towards the first surface 67 of the redistribution substrate 66. However, in contrast to the transistor device 60, in the transistor device 160, the gate terminal 62 is positioned on the second major surface 65 of the transistor device and laterally adjacent the drain terminal 64.

As the transistor device 160 has a vertical drift path, the gate structure within the semiconductor body of the transistor device 160 is positioned at the opposing first side 63 of the transistor device 160 and is electrically connected to the gate terminal 62 on the opposing second side 65 of the transistor device 160 by a conductive via 85 which extends through the thickness of the transistor device 160. The conductive via 85 is commonly referred to as a through silicon via (TSV).

The gate terminal 62 on the second major surface 65 faces downwards towards the upper surface 67 of the redistribution substrate 66 and is electrically connected to the gate electrode 55 on the opposing surface 68 of the redistribution substrate 66 by a vertical connection 70 which extends through the thickness of the redistribution board 66. The vertical connection 70 may be one or more conductive vias or one or more apertures filled with solder 71 and/or lined with conductive material as for the drain terminal 64 and also for the gate terminal 62 of the packaged low side switch 39.

In this embodiment, the second side 51 of the packaged high side switch 40 may include a single electrode, namely a single power electrode 50 which is electrically coupled to source. A further conductive connection 74 may be positioned on the insulating material 73 which extends from the upwardly facing source terminal 61 to the opposing side of the transistor device 160 and to the first major surface 67 of the redistribution substrate 66. The first side 49 of the package high side switch 40, which is to be mounted on the substrate, includes the drain electrode 48 and the gate electrode 55.

Figure 5:
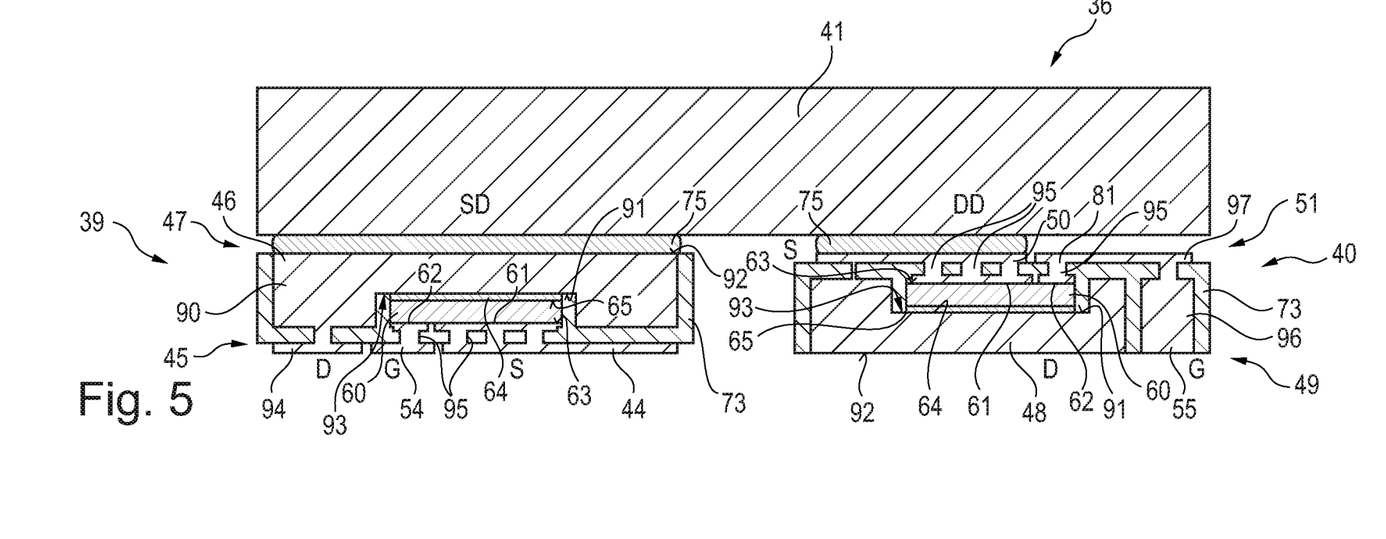
FIG. 5 illustrates a cross-sectional view of a half bridge circuit according to an embodiment.

FIG. 5 illustrates a half bridge circuit 36 including a packaged low side switch 39 and a packaged high side switch 40 having power electrodes on two opposing major sides of the respective package. The packaged low side switch 39 and the packaged high side switch 40 of the embodiment illustrated in FIG. 5 differ from the embodiments illustrated in FIGS. 3 and 4 in the internal structure of the package.

The packaged low side switch 39 includes a transistor device 60 including a vertical drift path which has a first power terminal in the form of a source terminal 61 and a gate terminal 62 on a first surface 63 and a drain terminal 64 on the opposing second surface 65. The first surface 63 faces downwards and the second surface 65 upwards towards the phase output lead 41.

The packaged low side switch 39 includes a leadframe 90 formed of a conductive material such as copper which is positioned on the drain terminal 61. A first surface 91 of the leadframe 90 is positioned on and electrically coupled to the drain terminal 64 and an opposing second surface 92 of the leadframe 90 provides the second power electrode 46 at the second major surface 47 of the packaged low side switch 39 which is coupled to drain. The second surface 92 faces upwardly and is coupled to the first phase output lead 41 by solder 75. The leadframe 90 is positioned vertically between the transistor 60 of the packaged low side switch 39 and the first phase output lead.

The leadframe 90 may have the form of a substantially planar plate that acts as a die pad. In some embodiments, such as that illustrated in FIG. 5, the leadframe 90 may have the form of a can having a base portion and side walls forming a recess 93 in the first surface 91 in which the transistor device 60 is mounted. The second surface 65 of the transistor device 60 is mounted on the base portion of the recess 93 and the first surface 63 of the transistor device 60 may be substantially coplanar with the upper surface of the side walls of the recess 93.

The leadframe 90 is also electrically connected to a further drain electrode 94 positioned on the opposing first major surface 45 of the packaged low side switch 39. The first major surface 45 of the packaged low side switch 39 further includes a first power electrode 44 which is electrically coupled to the source terminal 61 and a gate electrode 54 which is electrically connected to the gate terminal 62. The gate electrode 54 and the source electrode 44 may be positioned at least partly under the transistor device 60. The leadframe 90 as well as the side faces and first surface 63 of the transistor device 60 are embedded in an insulating material 73. The upwardly facing second surface 92 of the leadframe 90 is exposed from the insulating material 73 to form the drain electrode 48 at the second side 47. The source terminal 61 of the transistor device is electrically connected to the source electrode 44 by one or more conductive vias 95 and the gate terminal 62 is electrically connected to the gate electrode 54 by one or more conductive vias 95 that extend through the insulating material 73 positioned on the first surface 63 of the transistor device 60 between the respective terminal and electrode. The electrodes 44, 54, 94 are positioned on the insulating material 73 and form the outer contact pads of the packaged low side switch 39.

The packaged high side switch 40 has similar structure except that the second surface 92 of the leadframe 90 providing the second power electrode 46 faces downwards away from the first phase output lead 41 and is exposed from the insulating material 73 to provide the drain electrode 48 at the first side 49 of the packaged high side switch 40. In the packaged high side switch 40, the transistor device 60 is positioned vertically between the leadframe 90 and the first phase output lead 41. The first opposing surface 91 of the lead frame 90 is embedded within the insulating material 73. The transistor device 60 is mounted on the first surface 91 of the lead frame 90 such that the drain terminal 64 is mounted on and electrically connected to the leadframe 90. The source terminal 61 and gate terminal 62 of the transistor device face upwardly and are electrically connected to a source electrode 50 and a gate electrode 81, respectively, positioned on the opposing first side 51 of the packaged high side switch 40.

The source and gate electrodes 50, 81 are spaced apart and electrically insulated from the leadframe 90 by a portion of the insulating material 73 such that the source electrode 50 is electrically coupled to the source terminal 51 by one or more conductive vias 95 and the gate electrode 72 is electrically connected by one more conductive vias 95 to the gate terminal 62. In this embodiment, the first major surface 51 of the packaged high side switch 40 includes one power electrode 50 coupled to source and one gate electrode 81. The source electrode 50 is electrically connected to the first output lead 41 by solder 75.

The gate electrode 81 is electrically coupled to gate the electrode 55 positioned on the opposing side 49 of the packaged high side switch 40 by a conductive via 96 which extends through the thickness of the insulating layer 73 and by a lateral conductive layer 97 that extends over the insulating material 73 from the electrode 81 to the conducive via 96. The conductive via 96 may be formed by a portion of the leadframe 90 that is laterally spaced apart from the portion of the leadframe 90 on which the transistor 60 is mounted. The insulating material 73 is used to electrically insulate the two portions from one another. The second side 49 of the packaged high side switch 40 therefore includes a power electrode 48 which is electrically coupled to the drain terminal 64 of the transistor device 60 and a gate electrode 55. The second side of the packaged high side switch 49 and the second side 45 of the packaged low side switch 45 are substantially coplanar with one another.

Figure 6:
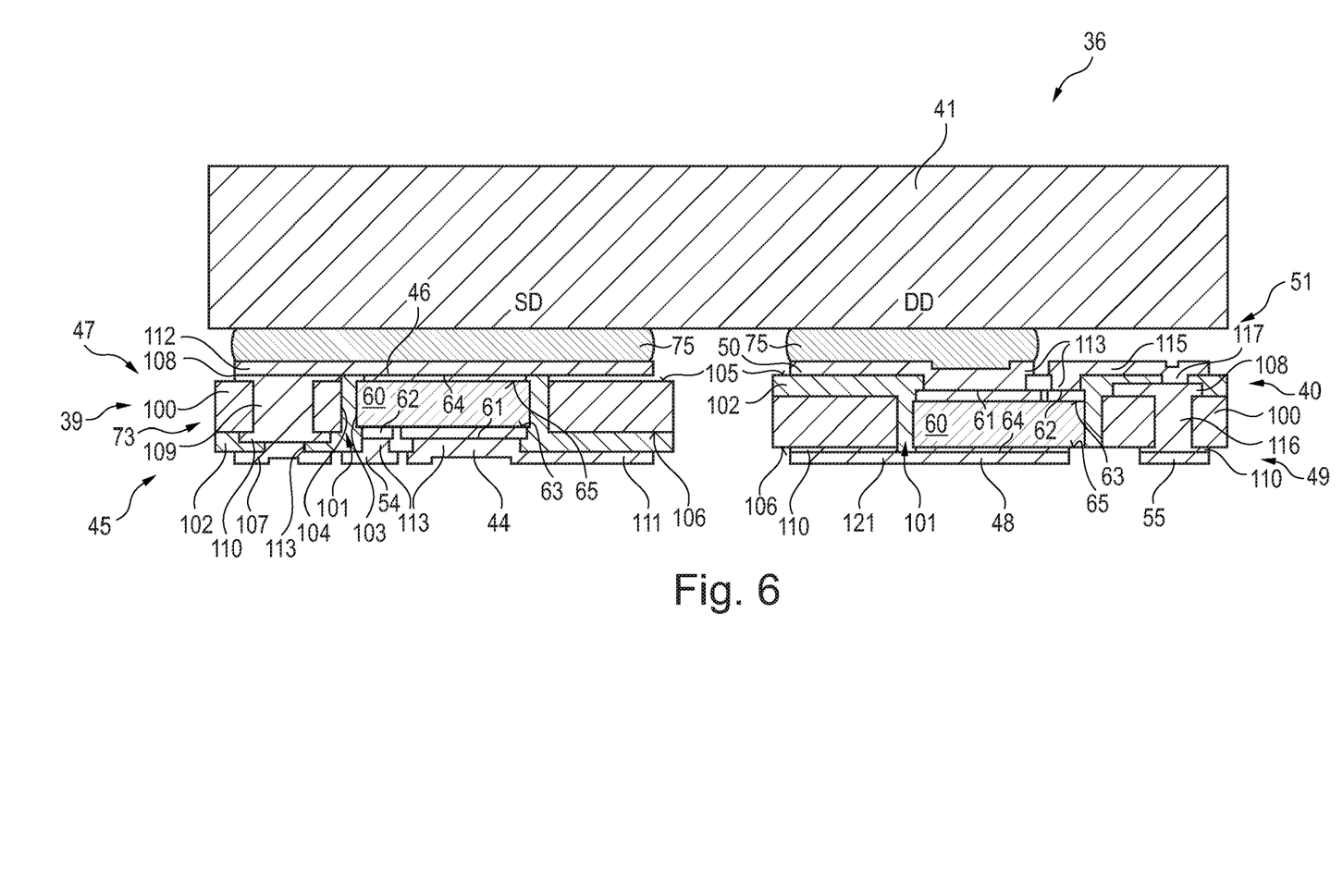
FIG. 6 illustrates a cross-sectional view of a half bridge circuit according to an embodiment.

FIG. 6 illustrates a cross-sectional view of a half bridge circuit 36 including a packaged low side switch 39 and a packaged high side switch 40, each having power electrodes on two opposing sides of the respective package. The packaged low side switch 39 and the packaged high side switch 40 of the embodiment illustrated in FIG. 6 differ from those illustrated in FIGS. 3 to 5 in the internal structure of the respective package.

The packaged low side switch 39 and the packaged high side switch 40 each include a vertical transistor device 60 embedded in an insulating material 73. In the embodiment illustrated in FIG. 6, the insulating material 73 comprises a core layer 100 which is formed of a substantially planar prefabricated board. The core layer 100 includes an aperture

101 which extends through the thickness of the core layer 100 from the first major surface 105 to the opposing second major surface 106. The transistor device 60 is positioned in the aperture 101.

The core layer 100 is formed from a substantially planar prefabricated board which may include a dielectric material such as glass fibre reinforced matrix, or other material, which is typically used to fabricate a core layer for a printed circuit board. For example, the dielectric core layer may include a glass fibre reinforced epoxy resin, such as FR4. The dielectric core layer may include PTFE (Polytetrafluoroethylene), PEN (Polyethylene Naphthalate), PET (Polyethylene Terephthalate, BT laminate (Bismaleimide-Triazine) or Polyimide, for example.

The transistor device 60 is secured within the aperture 101 by further insulating material 102 which may, for example, comprise an epoxy resin which occupies the space between the side faces 103 of the transistor device 60 and the side faces 104 of the aperture 101. The further insulating material 102 may be further positioned on regions of the first major surface 105 and opposing second major surface 106 of the core layer 100. A first conductive layer 108 which may be structured to form several laterally separate portions is positioned on the first major surface 105 of the core layer 100 and a second conductive layer 110 is positioned on the second major surface 106 of the core layer 100.

In the packaged low side switch 39, the transistor device 60 has a source down (SD) arrangement so that its first major surface 63, which includes a source terminal 61 and a gate terminal 62, faces downwardly and its opposing second surface 65 includes a drain terminal 64 which faces upwardly and is electrically coupled to the first output phase lead 41 by solder 75. The drain terminal 65 may be substantially coplanar with the second major surface 105 of the core layer 100. In embodiments in which the drain terminal 65 includes a metallisation layer, the metallisation layer may be substantially coplanar with the first conductive layer 108 positioned on the first major surface 105 of the core layer 100. The drain terminal 65 may be electrically coupled to a drain contact pad 107 positioned on the opposing second surface 106 of the core layer 100 by means of the lateral conductive redistribution layer 112 and conductive via 109. The lateral conductive redistribution layer 112 is positioned on the first major surface 105 of the core layer 100, on the drain terminal 65, on the further material 102 positioned in the gap between the transistor device 60 and the core layer 100 and the conductive via 109 which extends through the thickness of the core layer 100 to the outer contact pad 107 positioned on the second major surface 106 of the core layer 100.

The source terminal 61 and gate terminal 62 may include a metallisation layer which is substantially coplanar with the second major surface 106 of the core layer 100. The source terminal 61 and the gate terminal 62 may be coplanar with the second major surface or, if present, with the second conductive layer 110 positioned on the second major surface 106 of the core layer 110.

The further insulating material 102 may extend over the second major surface 106 of the core layer and the transistor device 60 with the outer contact pads 44, 54, 107 formed from a further conductive layer 111 positioned on this further insulating layer 102. Conductive vias 113 may be provided between the outer contact pads 44, 54 and the respective source and gate terminal 61, 62 on the transistor device 60 and between the contact pad 107 and the conductive layer 110 formed on the second major surface 106 and on the conductive via 109 formed in the core layer 100.

The packaged high side switch 40 has a drain down (DD) arrangement and includes a core layer 100 with an aperture 101 in which the transistor device 60 is arranged as in the packaged low side switch 39. The packaged high side switch 40 differs in that the drain terminal 65 is substantially coplanar with the second major surface 106 of the core layer 100 and faces downwards and the source terminal 61 and gate terminal 62 are substantially coplanar with the first major surface 105 of the core layer 100 and face upwards towards the phase output lead 41.

The further insulating layer 102 is positioned in the gap between the side faces 103 of the transistor device 60 and the side faces 104 of the aperture 101 in the core layer 100 and extends over the first major surface 105 of the core layer 100. The further insulating layer 102 may also extend over the second major surface 106 of the core layer 100. The source terminal 61 of the transistor device 60 is electrically connected to a source contact pad 50 positioned on the further material 102 positioned on the second major surface 105 by a conductive via 113. The source contact pad 50 is electrically coupled to the first phase output lead 41 by solder 75. The gate terminal 62 of the transistor device 60 is electrically coupled to a gate pad 55 positioned on the opposing second major surface 106 of the core layer 100 by a lateral redistribution structure 115 positioned on the further material 102 positioned on the second major surface 105 of the core layer 100 and by a conductive via 116 which extends through the thickness of the core layer 100 to the gate contact pad 55.

The core layer 100 may include a conductive layer 108 positioned directly on its first major surface 105 which is covered by the further insulating material 102. In these embodiments, a further conductive via 117 is provided, which extends from the lateral redistribution structure 115 to the conductive layer 108 positioned on the first major surface 105 and to the conductive via 116 which extends through the thickness of the core layer 100. The drain terminal 64 may be electrically coupled to a drain contact pad 48 which extends from the drain terminal 65 of the transistor device 60 onto the first major surface 106 of the core layer 100.

The second major surface 106 may also include a conductive layer 110 positioned directly on the first major surface 106 which is electrically connected to the drain terminal 64 by a conductive layer 121 which extends from the drain terminal 64 over the further material 102 positioned in the gap between the side face 104 of the aperture 101 and the side face 103 of the transistor device 60 to the conductive layer 110 and which forms the drain contact pad 48. The conductive layer 121 is poisoned on the conductive via 117 and the conductive layer 110 to form the gate contact pad 54. In this embodiment, the drain contact pad 48 forms the drain electrode and the gate contact pad 55 forms the gate electrode.

In this embodiment, the lower surface 45 of the packaged low side switch 39 includes a drain contact pad 107, gate contact pad 54 and a source contact pad 44. The lower surface 49 of the packaged high side switch 40 includes a drain contact pad 48 and the gate contact pad 55.

Figure 7:
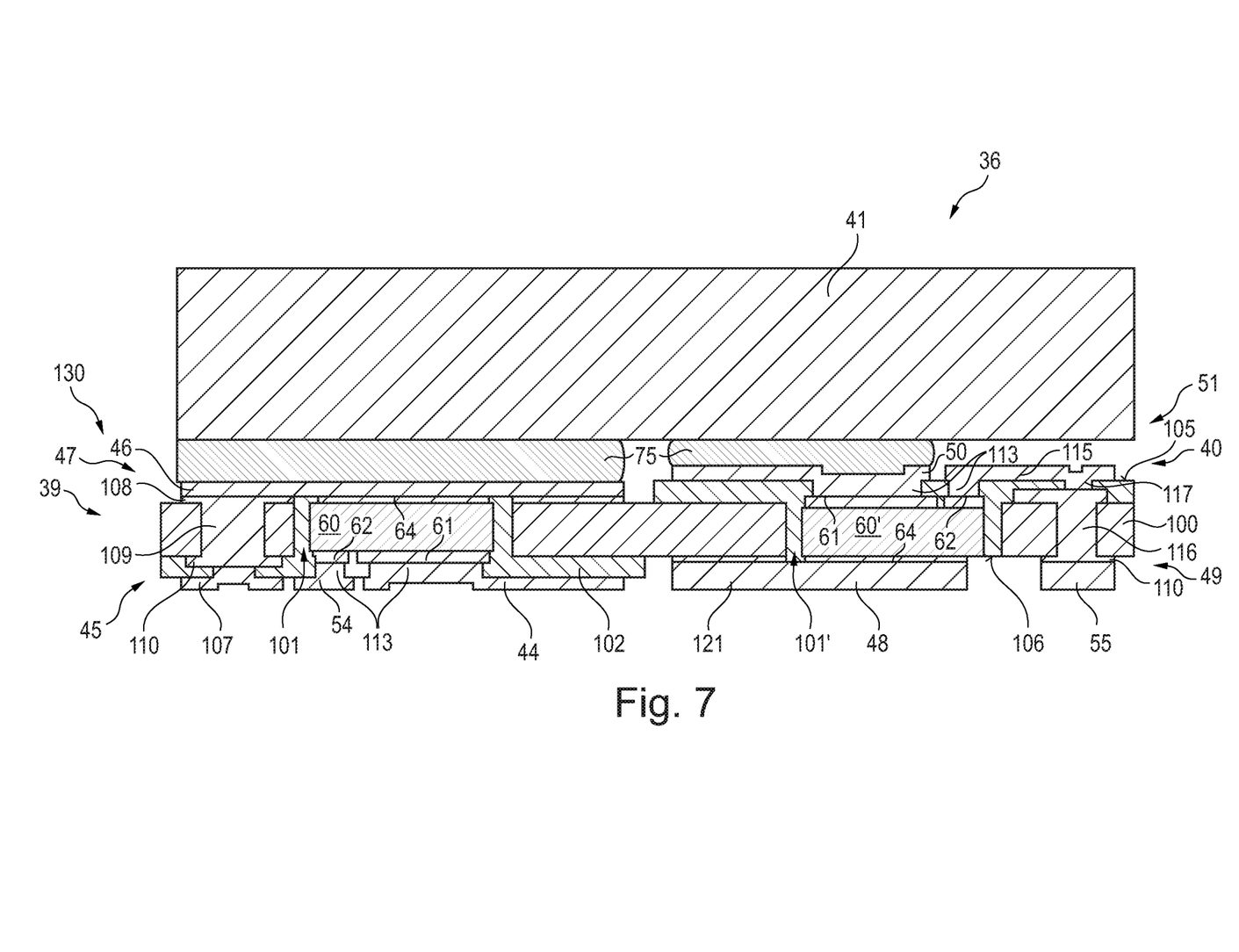
FIG. 7 illustrates a cross-sectional view of a half bridge circuit according to an embodiment.

FIG. 7 illustrates a cross-sectional view of a half bridge circuit 36 including a packaged high side switch 39 and packaged high side switch 40 which are accommodated within a single common package 130. The internal structure of the common package 130 is similar to that illustrated in FIG. 6 and includes a core layer 100 with two apertures 101 whereby the transistor 60 providing the low side switch 39 is positioned in a first aperture 101 and the transistor 60' providing the high side switch 40 is positioned in the second aperture 101'.

In the embodiment illustrated in FIG. 7, the drain contact pad 46 positioned on the upwardly facing drain terminal 65 of the low side switch 39 is laterally separate from the source contact pad 50 positioned on the upwardly facing source terminal 61 of the high side switch 40 such that the electrical connection between them is provided externally to the common package 130 by the first phase output lead 41 and the two solder deposits 75. However, in other non-illustrated embodiments, a common lateral redistribution structure may be provided which extends between the drain terminal 65 of the low side switch 39 and the source terminal 61 of the high side switch 40 which forms part of the common package 130. The first phase output lead 41 is then connected to this common lateral redistribution structure by solder or conductive adhesive.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise. It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A multiphase inverter apparatus, comprising:
   an insulating substrate comprising a conductive redistribution structure on a first surface, the conductive redistribution structure comprising at least one low voltage bus and at least one high voltage bus;
   a plurality of half-bridge circuits, each half-bridge circuit being electrically coupled between a respective one of the at least one low voltage bus and a respective one of the at least one high voltage bus; and
   a phase output lead for each half-bridge circuit,
   wherein each half bridge circuit comprises a packaged low side switch, a packaged high side switch, and a phase output that is electrically coupled with the respective phase output lead,
   wherein for each half bridge circuit, the packaged low side switch and the packaged high side switch are arranged on the first surface of the insulating substrate,
   wherein for each half bridge circuit, the phase output lead is arranged on and electrically coupled to the packaged low side switch and the packaged high side switch such that the packaged low side switch and the packaged high side switch are arranged vertically between the phase output lead and the first surface of the insulating substrate.

2. The multiphase inverter apparatus of claim 1, wherein each half bridge circuit comprises a plurality of packaged low side switches electrically coupled in parallel with one another and a plurality of packaged high side switches coupled in parallel with one another, and wherein for each half bridge circuit, the phase output lead is arranged on and electrically coupled to the plurality of packaged low side switches and the plurality of packaged high side switches.

3. The multiphase inverter apparatus of claim 2, wherein for each half bridge circuit, the plurality of packaged low side switches are mounted on and electrically coupled to a common one of the at least one low voltage bus, and wherein for each half bridge circuit, the plurality of packaged high side switches are mounted on and electrically coupled to a common one of the at least one high voltage bus.

4. The multiphase inverter apparatus of claim 2, wherein for each half bridge circuit, the packaged low side switches each have power electrodes on opposing major sides, and wherein for each half bridge circuit, the packaged high side switches each have power electrodes on opposing major sides.

5. The multiphase inverter apparatus of claim 4, wherein for each half bridge circuit, the packaged low side switches each have a source down configuration and the packaged high side switches each have a drain down configuration.

6. The multiphase inverter apparatus of claim 5, wherein for each half bridge circuit, the phase output lead is arranged on and electrically connected with a drain electrode of the packaged low side switches and a source electrode of the packaged high side switches.

7. The multiphase inverter apparatus of claim 1, wherein for each half bridge circuit, the packaged low side switch comprises:
   a first power electrode on a first side, the first power electrode being mounted on and electrically connected to the respective low voltage bus; and
   a second power electrode on a second side opposing the first side, the phase output lead being mounted on and electrically connected to the second power electrode.

8. The multiphase inverter apparatus of claim 7, wherein for each half bridge circuit, the first power electrode of the packaged low side switch is a source electrode and the second power electrode of the packaged low side switch is a drain electrode.

9. The multiphase inverter apparatus of claim 7, wherein for each half bridge circuit, the packaged high side switch comprises:
   a second power electrode on a first side, the second power electrode being mounted on and electrically connected to the respective high voltage bus; and
   a first power electrode on a second side opposing the first side, the phase output lead being mounted on and electrically connected to the first power electrode.

10. The multiphase inverter apparatus of claim 9, wherein for each half bridge circuit, the first power electrode of the packaged high side switch is a source electrode and the second power electrode of the packaged high side switch is a drain electrode.

11. The multiphase inverter apparatus of claim 1, wherein for each half bridge circuit, the packaged low side switch and the packaged high side switch are disposed in a common package or in separate packages.

12. The multiphase inverter apparatus of claim 1, wherein for each half bridge circuit, the packaged high side switch comprises a MOSFET or IGBT or BJT or a HEMT, and wherein for each half bridge circuit, the packaged low side switch comprises a MOSFET or IGBT or BJT or a HEMT.

13. The multiphase inverter apparatus of claim 1, wherein the half bridge circuits of each phase are mounted laterally adjacent one another on the first surface of the insulating substrate, wherein the packaged low side switch of a first half bridge circuit and the packaged low side switch of a second half bridge circuit are mounted on and electrically coupled to a common low voltage bus, and wherein the packaged high side switch of the second half bridge circuit and the packaged high side switch of a third half bridge circuit are mounted on and electrically coupled to a common high voltage bus.

14. The multiphase inverter apparatus of claim 1, wherein the multiphase inverter apparatus provides a three phase inverter circuit.

15. The multiphase inverter apparatus of claim 1, further comprising a high voltage lead positioned on the at least one high voltage bus and a low voltage lead positioned on the at least one low voltage bus.

16. The multiphase inverter apparatus of claim 1, wherein the conductive redistribution structure comprises a conductive trace which extends substantially parallel to the at least one low voltage bus such that each gate electrode of the packaged low side switches of a single half bridge circuit are connected in parallel to the conductive trace.

17. The multiphase inverter apparatus of claim 16, wherein the conductive redistribution structure comprises a further conductive trace which extends substantially parallel to the at least one low voltage bus and the conductive trace for the gate electrodes, and wherein the further conductive trace is electrically coupled to each source electrode of the packaged low side switches.

18. The multiphase inverter apparatus of claim 1, wherein the conductive redistribution structure comprises a conductive trace which extends substantially parallel to the at least one low voltage bus such that each gate electrode of the packaged high side switches of a single half bridge circuit are connected in parallel to the conductive trace.

19. The multiphase inverter apparatus of claim 18, wherein the conductive redistribution structure comprises a further conductive trace which extends substantially parallel to the at least one high voltage bus and the conductive trace for the gate electrodes, and wherein the further conductive trace is electrically coupled to each source electrode of the packaged high side switches.

* * * * *